United States Patent
Steinke

(10) Patent No.: US 10,251,284 B2
(45) Date of Patent: Apr. 2, 2019

(54) EASY ASSEMBLY CONTROL PANEL

(71) Applicant: S.J. Electro Systems, Inc., Detroit Lakes, MN (US)

(72) Inventor: Corey Lee Steinke, Detroit Lakes, MN (US)

(73) Assignee: S.J. Electro Systems, Inc., Detroit Lakes, MN (US)

( * ) Notice: Subject to any disclaimer, the term of this patent is extended or adjusted under 35 U.S.C. 154(b) by 0 days.

(21) Appl. No.: 15/586,962

(22) Filed: May 4, 2017

(65) Prior Publication Data
US 2018/0110151 A1  Apr. 19, 2018

Related U.S. Application Data

(60) Provisional application No. 62/332,909, filed on May 6, 2016.

(51) Int. Cl.
| | | |
|---|---|---|
| H05K 5/00 | (2006.01) | |
| G08B 21/18 | (2006.01) | |
| H05K 7/14 | (2006.01) | |
| G08B 25/14 | (2006.01) | |
| H01H 9/02 | (2006.01) | |
| H01R 9/24 | (2006.01) | |
| H02B 1/32 | (2006.01) | |
| H05K 5/02 | (2006.01) | |

(52) U.S. Cl.
CPC .......... *H05K 5/0017* (2013.01); *G08B 21/182* (2013.01); *H05K 5/02* (2013.01); *H05K 7/1461* (2013.01); *G08B 25/14* (2013.01); *H01H 9/0271* (2013.01); *H01R 9/2425* (2013.01); *H02B 1/32* (2013.01)

(58) Field of Classification Search
CPC .......... H05K 7/1461; H05K 5/02; H02B 1/32; H01R 9/2425; G08B 25/14; G08B 24/182
USPC .......................................................... 340/618
See application file for complete search history.

(56) References Cited

U.S. PATENT DOCUMENTS

| | | | | |
|---|---|---|---|---|
| 5,696,493 A | * | 12/1997 | Einck ...................... | C02F 3/006 340/618 |
| 7,224,283 B1 | * | 5/2007 | Chandler, Jr. .......... | G01F 23/14 340/603 |
| 7,348,499 B1 | * | 3/2008 | Cox ......................... | H02B 1/48 174/549 |
| 2002/0109592 A1 | * | 8/2002 | Capano .................. | G05B 15/02 340/540 |
| 2005/0157889 A1 | * | 7/2005 | Yonezu .................. | H04R 1/026 381/77 |
| 2012/0019391 A1 | * | 1/2012 | Goings ................. | G01R 19/145 340/657 |
| 2012/0170782 A1 | * | 7/2012 | Ettinger ................. | H04R 1/028 381/332 |

(Continued)

*Primary Examiner* — Zachary Pape
(74) *Attorney, Agent, or Firm* — Dicke, Billig & Czaja, PLLC

(57) ABSTRACT

An easy assembly control panel and method is disclosed. In one example, an enclosure is provided having a pilot device coupled to the enclosure. A pre-assembled control panel is inserted into the enclosure, quick coupling the control panel to the pilot device and providing control communication between the pilot device and the control panel. No additional manual wiring or manual mechanical coupling is needed to couple the user interface device to the control panel. The control panel can be used as part of a system, such as a submersible pump system.

17 Claims, 13 Drawing Sheets

(56) References Cited

U.S. PATENT DOCUMENTS

2012/0298492 A1* 11/2012 Westphal ............. G02B 6/0008
200/314
2014/0254189 A1* 9/2014 Stein .................... B60Q 1/2611
362/540
2014/0266745 A1* 9/2014 Middleton ........... G08B 21/182
340/618
2017/0366110 A1* 12/2017 Omari ....................... H02P 1/02

* cited by examiner

EASY ASSEMBLY CONTROL PANEL

CROSS-REFERENCE TO RELATED APPLICATIONS

This Utility Patent Application is a non-provisional application of U.S. Ser. No. 62/332,909, filed May 6, 2016, which is incorporated herein by reference.

BACKGROUND

Control panels typically require that traditional wiring methods are employed to connect pilot devices to the logic and control system. These devices can be visual notification beacons, audible notifications, or switches for user inputs, among others. The pilot devices are often required to be accessible outside the control panel enclosure, in order to ensure the electrical safety of the user. The logic and control circuitry is often connected to mains electricity, which can be hazardous to an untrained individual. The control panel, also, often provides an environmental barrier to the logic and control circuitry. This enables the system to be employed in dusty, wet, or frozen environments, without the risk of damage to the logic and control system, or harm to the user, by these potential contaminants.

The traditional wiring of the externally accessible pilot devices is often labor intensive and adds a large portion of the cost and complexity to the assembly of the control panel. With traditional wiring methods for external pilot devices, there is also an increased chance for mis-wiring and poor quality connections to be made. See, for example, the manually or field wired control panel assembly shown in FIG. 1.

For the reasons stated above and for other reasons stated below, which will become apparent to those skilled in the art upon reading and understanding the present specification, there is a need in the art for an improved and effective system for improving the assembly of a control panel.

SUMMARY

The above mentioned problems of current control panel wiring methods are addressed by embodiments of the present invention and will be understood by reading and studying the following specification. The following summary is made by way of example and not by way of limitation. It is merely provided to aid the reader in understanding some of the aspects of the invention.

In one embodiment, the logic and control circuitry is contained on a printed wiring board assembly which attaches to a rigid body and includes electrical spring contact terminals or pins, or printed circuit conductors. The pilot devices are affixed through the control panel enclosure walls, with electrical connections of the devices facing the interior of the control panel enclosure. The printed wiring assembly attached to the rigid body inserts into the control panel enclosure assembly, with electrical contacts from the two assemblies mating to complete the electrical connections.

In another embodiment, the logic and control circuitry is contained on a printed wiring board assembly which attaches to a rigid body and includes visual notification beacons, audible notification devices, or electrical switch mechanisms. The pilot devices are affixed through the control panel enclosure walls, with mechanical barriers to separate the outside, non-environmentally protected portion of the enclosure from the interior, environmentally protected, portion of the control panel enclosure. The printed wiring assembly attached to the rigid body inserts into the control panel enclosure assembly, with the mechanical interfaces of the two assemblies mating to complete the user interface device or devices with the logic and control circuitry.

In another embodiment, the logic and control circuitry is contained on a printed wiring board assembly which attaches to a rigid body and includes a combination of electrical spring contact terminal or pins, printed circuit conductors, or visual notification beacons, audible notification devices, or electrical switch mechanisms. The pilot devices are affixed through the control panel enclosure walls, with mechanical barriers to separate the outside, non-environmentally protected, portion of the enclosure from the interior, environmentally protected, portion of the control panel enclosure and may include electrical connections, which face the interior of the control panel enclosure. The printed wiring assembly attached to the rigid body inserts into the control panel enclosure assembly, with the mechanical and electrical interfaces mating to complete the connection of the pilot device or devices with the logic and control circuitry.

In another embodiment, the logic and control circuitry is contained on a printed wiring board assembly, which mates directly with the control panel and pilot device assembly.

In another embodiment, the final control panel assembly contains a combination of traditionally wired devices and devices that are connected using the method described in the previous embodiments.

DETAILED DESCRIPTION

Figure 1:
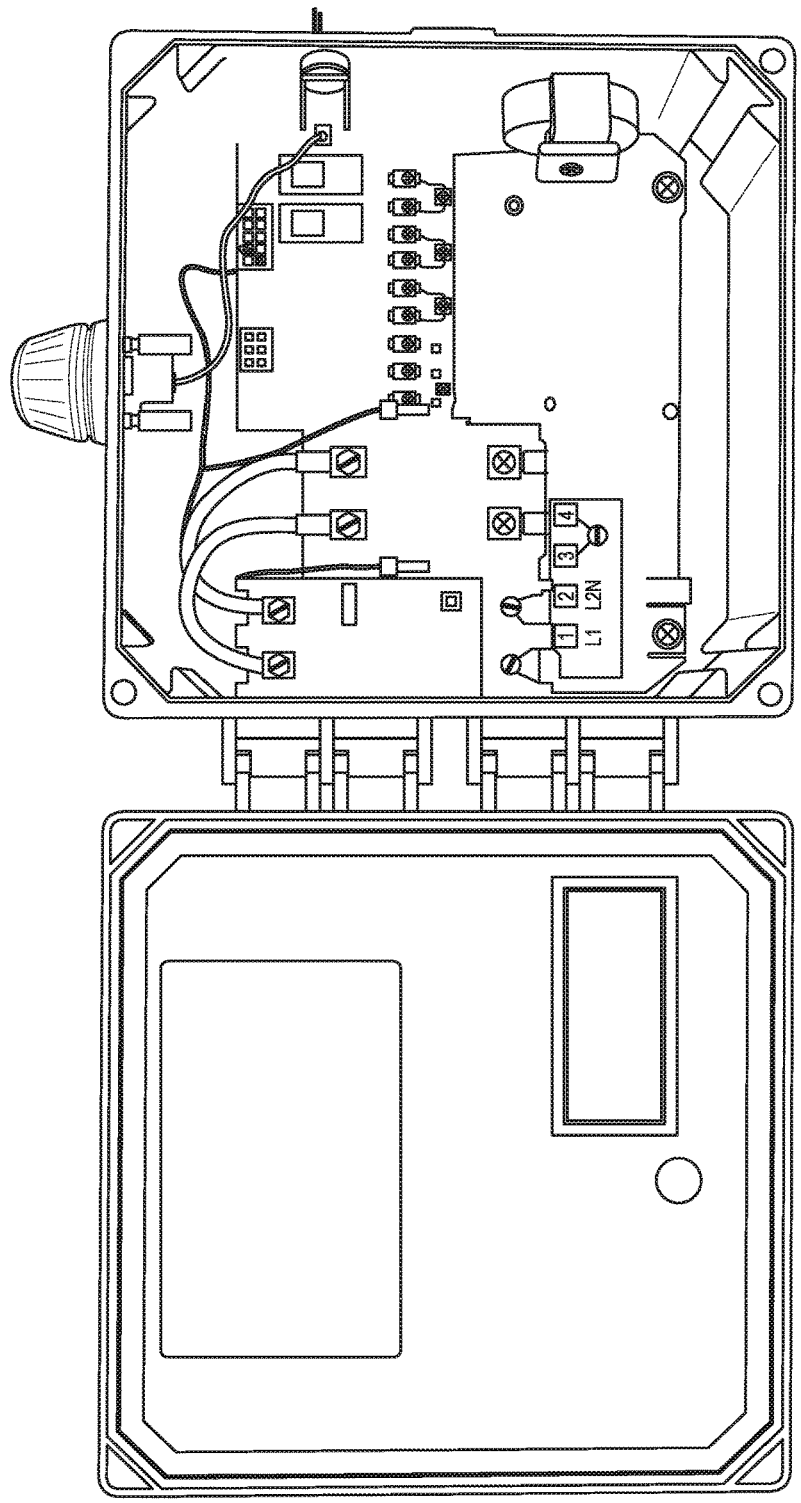
FIG. 1 illustrates one example of a prior art wired control panel.

In the following Detailed Description, reference is made to the accompanying drawings which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

An easy assembly control panel and method is disclosed. In one example, an enclosure is provided having a user interface device or pilot device coupled to the enclosure. A pre-assembled control panel is inserted into the enclosure, quick coupling the control panel to the pilot device thereby providing a control communication between the pilot device and the control panel. No additional manual wiring or mechanical coupling is needed to couple the pilot device to the control panel. The control panel can be used as part of a system to control one or more motors or pumps, such as a submersible pump system.

In one embodiment, the logic and control circuitry is contained on a printed wiring board assembly (a control board) which attaches to a rigid body and includes electrical spring contact terminals or pins, or printed circuit conductors. The pilot devices are affixed through the control panel enclosure walls, with electrical connections of the devices facing the interior of the control panel enclosure. The printed wiring assembly attached to the rigid body inserts into the control panel enclosure assembly, with electrical contacts from the two assemblies mating to complete the electrical connections.

In another embodiment, the logic and control circuitry is contained on a printed wiring board assembly which attaches to a rigid body and includes visual notification beacons, audible notification devices, or electrical switch mechanisms. The pilot devices are affixed through the control panel enclosure walls, with mechanical barriers to separate the outside, non-environmentally protected portion of the enclosure from the interior, environmentally protected, portion of the control panel enclosure. The printed wiring assembly attached to the rigid body inserts into the control panel enclosure assembly, with the mechanical interfaces of the two assemblies mating to complete the user interface device or devices with the logic and control circuitry.

In another embodiment, the logic and control circuitry is contained on a printed wiring board assembly which attaches to a rigid body and includes a combination of electrical spring contact terminal or pins, printed circuit conductors, or visual notification beacons, audible notification devices, or electrical switch mechanisms. The pilot devices are affixed through the control panel enclosure walls, with mechanical barriers to separate the outside, non-environmentally protected, portion of the enclosure from the interior, environmentally protected, portion of the control panel enclosure and may include electrical connections, which face the interior of the control panel enclosure. The printed wiring assembly attached to the rigid body inserts into the control panel enclosure assembly, with the mechanical and electrical interfaces mating to complete the connection of the pilot device or devices with the logic and control circuitry.

In another embodiment, the logic and control circuitry is contained on a printed wiring board assembly, which mates directly with the control panel and pilot device assembly.

In another embodiment, the final control panel assembly contains a combination of traditionally wired devices and devices that are connected using the method described in the previous embodiments.

FIGS. 2-10 illustrate one or more examples of a control panel assembly. The control panel assembly provides for easy field assembly of a control panel to an enclosure, including pilot devices mounted on the enclosure, without the need for labor intensive manual wiring or other labor intensive mechanical connections.

Figure 2:
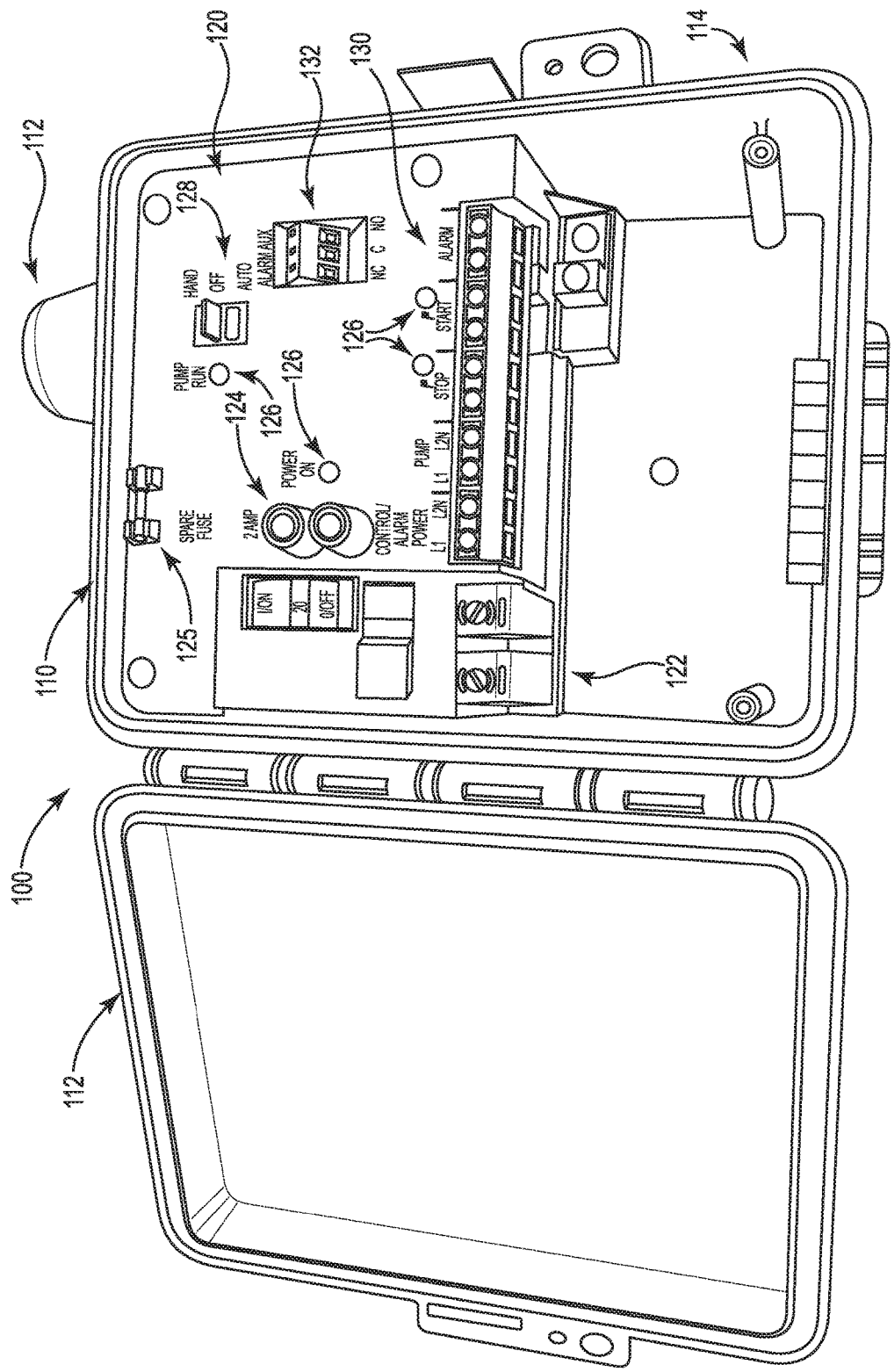
FIG. 2 illustrates one example of a control panel assembly.

FIG. 2 illustrates one example of a control panel assembly at 100. The control panel assembly 100 includes an enclosure 110 having one or more user interface devices or pilot devices 112 mounted on the enclosure 110. In this view, the enclosure 110 includes an enclosure door 112 shown in an open position relative to the enclosure body 114. The terms user interface device and pilot device are used interchangeably herein.

A control panel 120 is inserted and mounted inside the enclosure 112. The control panel 120 is mechanically coupled to the enclosure 110. In one example, the control panel 120 is secured to the enclosure 110 using screws or other mechanical means. By simply inserting the control panel 120 into the enclosure 110, the control panel 120 is quick coupled (and directly coupled) to the pilot device 112 and ready for operation. Quick coupling off the control panel to the pilot device provides for control communication between the control panel and the pilot device. No additional manual wiring, mechanical coupling or use of tools is required.

The term quick coupled as used herein is defined to mean that a control panel and pilot device are direct coupled together when the control panel is inserted into the enclosure, without the use of any manual wiring, manual connections, or tools.

The pilot devices 112 include one or more devices allowing a user to interface and be in control communication with the control panel 120 (located inside the enclosure) without having to access or open the enclosure 110. For example, a pilot device 112 may be a visual alarm, an audible alarm, or other interface or pilot device such as a switch (e.g., a push-button switch). For example, control communication between a pilot device and the control panel can provide for activation of a visual alarm or audible alarm (on the external side of the enclosure) by the control panel, or operation of a mechanical pilot device such as a switch to communicate with the control panel to silence an alarm.

Figure 3:
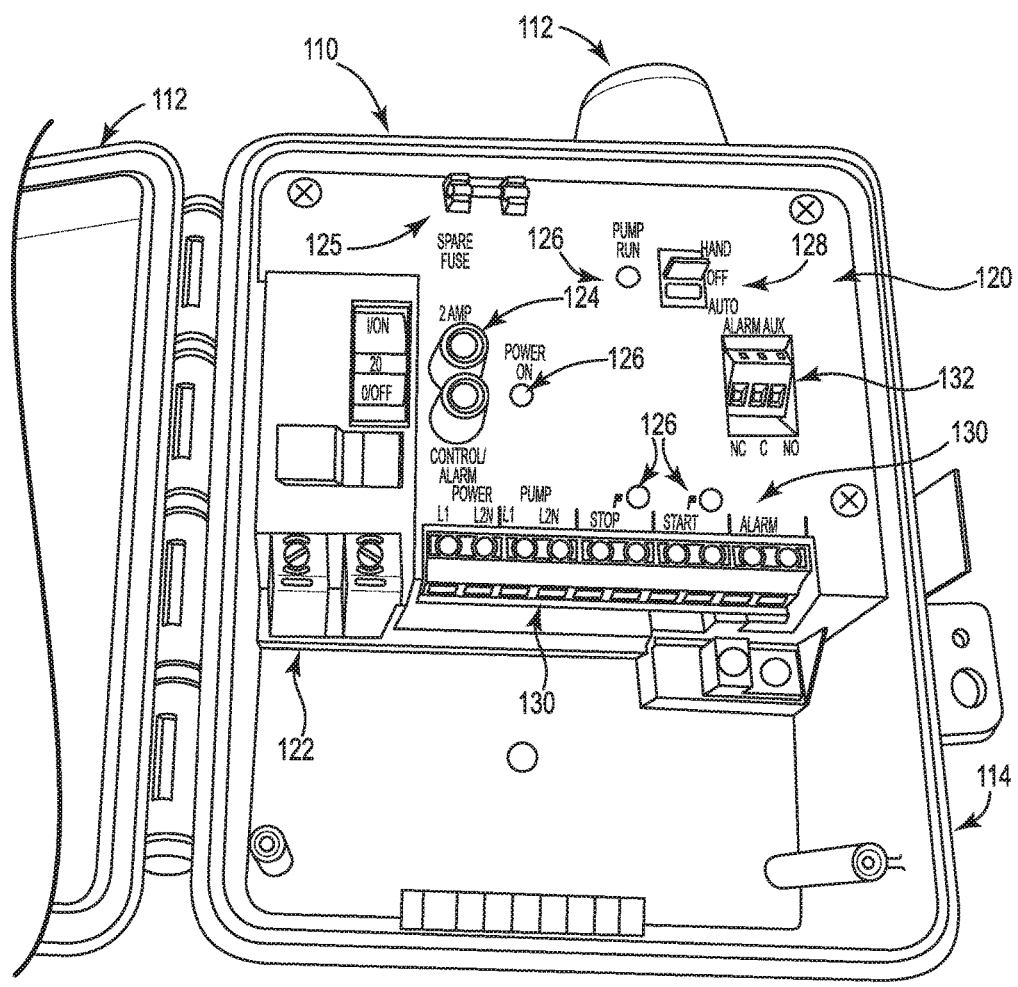
FIG. 3 illustrates one example of another view of the control panel assembly of FIG. 2.

Once assembled, the control panel assembly 100 is ready for use as part of a system that may include pumps or motors, such as a pump system. Control panel 120 includes additional mechanisms for coupling to an external system. In one example shown, the control panel includes a circuit breaker 122 for incoming power, fuse assembly 124 and spare fuse 125, visual indicators 126 (e.g., power on, pump run, stop, start, etc.), hand-off-automatic (HOA) switch 128, terminal blocks 130 for field wiring (e.g., pump or float switches), and auxiliary contacts 132. FIG. 3 illustrates another closer view of the control panel assembly 100 shown in FIG. 2.

Figure 4:
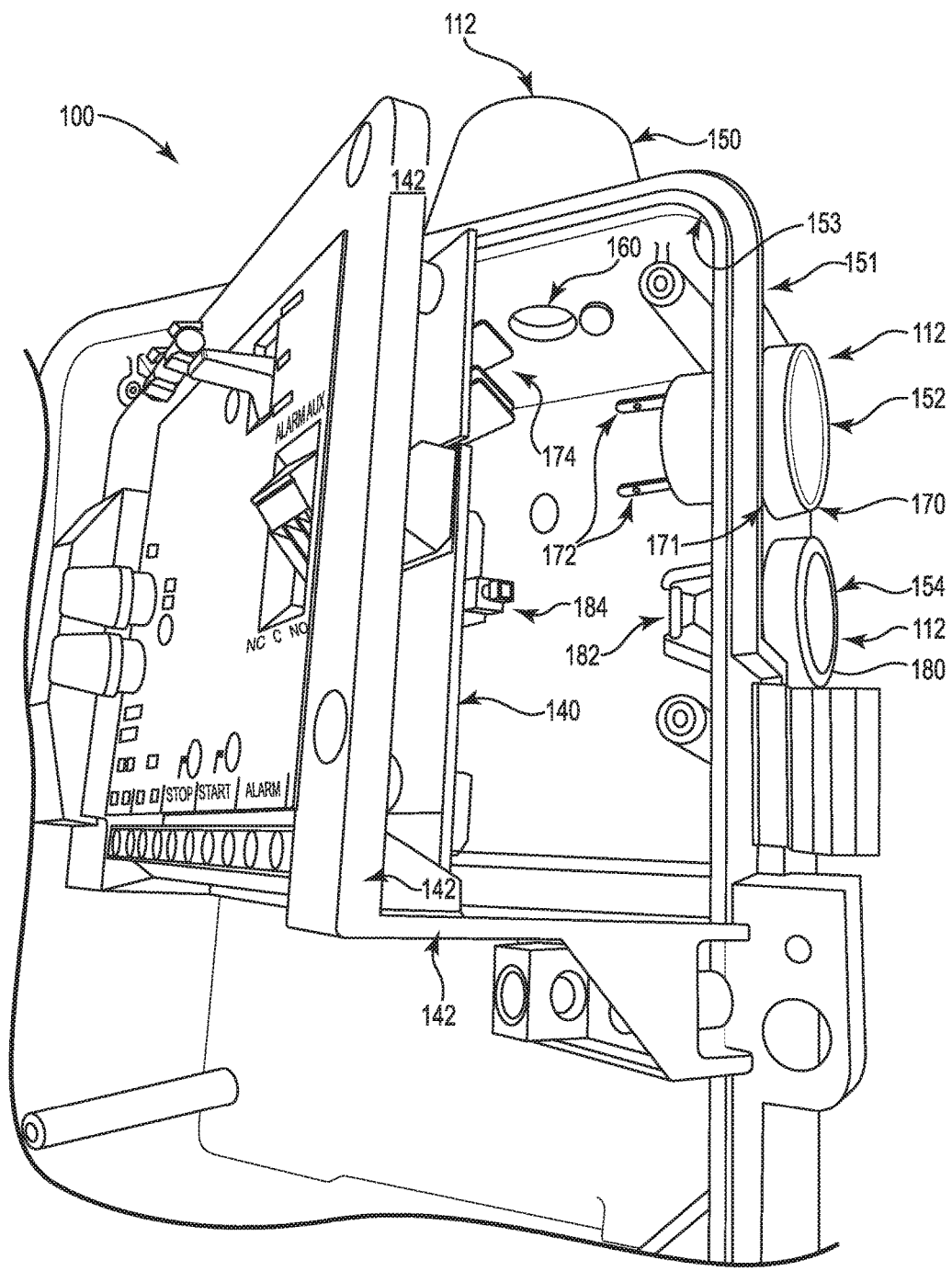
FIG. 4 illustrates one example of a control panel assembly, including a control panel partially inserted into an enclosure.

FIG. 4 illustrates another example of a control panel assembly, including one example of control panel 120 partially inserted into enclosure 110. Control panel 120 includes a control board 140 attached to a support member 142. Control board 140 is positioned on a back side of support member 142. In one example, the control panel 120 is pre-assembled, prior to insertion into enclosure 110.

In one example illustrated, the control panel assembly 100 includes three pilot devices. In one example, pilot devices are all different types of pilot devices. In other examples, the one or more of the pilot devices may be the same type of pilot device. The pilot devices 112 illustrated include a visual notification beacon 150, an audible device 152 (e.g., an audible alarm), and a switch 154. The pilot devices 112 are mechanically coupled (i.e., attached) to the enclosure 110, and interface with control board 140 via openings in the enclosure 110. The control panel includes one or more panel interfaces that quick couple the control panel to the pilot device, providing control communication between the control panel and each pilot device.

Figure 4A:
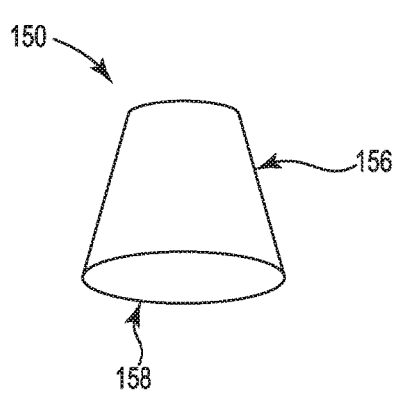
FIG. 4A is a diagram illustrating one example of a visual notification beacon housing.

Visual notification beacon 150 is secured to enclosure 110, and positioned on an external side 151 of the enclosure 110. In one example, a gasket provides a tight seal (e.g., weathertight) between the visual notification beacon 150 and enclosure 110. In reference also to FIG. 4A, the beacon 150 includes a housing 156 having an internal opening 158. The beacon 150 internal opening 158 is aligned with an enclosure opening 160.

Figure 4B:
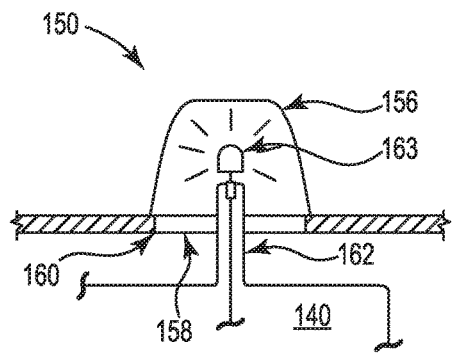
FIG. 4B is a diagram illustrating one example of a visual notification beacon.
Figure 4C:
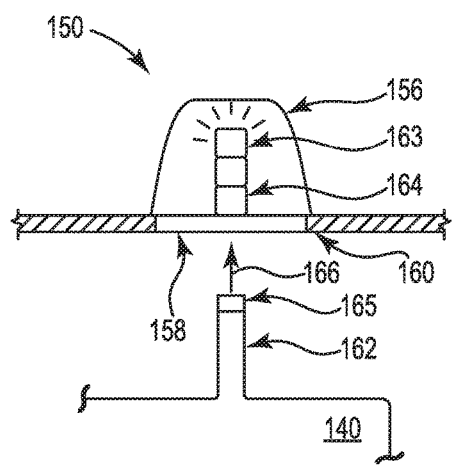
FIG. 4C is a diagram illustrating another example of a visual notification beacon.

In one aspect, control board 140 includes a panel interface in the form of an extension member 162. In one example also diagrammed in FIG. 4B, the control board 140 is generally rectangular shaped, and extension member 162 extends beyond the rectangular shape of the control board 140. One or more lights are positioned at an end of the extension member. In one example, a light 163 (e.g., and LED light) is positioned on each side and at the end of the extension member. In assembly, when the control panel 120 is positioned and inserted into the enclosure 110, the extension member 162 is inserted through the enclosure opening 160. The end of the extension member 162 (including the light 163) is positioned in the visual notification beacon 150 housing 156. As such, when the control panel 120 is inserted into the enclosure 110 for assembly, the control panel is directly and quick connected to the visual notification beacon 150 without the use of additional wiring or tools.

In other examples, visual beacon 150 is also automatically quick coupled to control board 140 when the control panel 120 is inserted into the enclosure 110. For example, visual beacon 150 may include light 163 external to the enclosure 110, and have a beacon electrode 164 (e.g., contact spades) internal to the housing 156. In this example, when the control panel 120 is inserted into the enclosure 110 the visual notification beacon 150 is direct and quick coupled to the control panel 120 via the extension member 162 electrode contact 165 being connected to the beacon electrode contact spades. As such, the visual notification beacon 150 is "plugged into" the control panel 120, indicated by arrow 166. No extra manual wiring is necessary to couple the visual beacon to the control panel.

When assembled, audible device 152 (e.g., an audible alarm device) is also quick coupled to control panel 120. In one example, audible device 152 is coupled to enclosure 110, positioned at an opening 171 in enclosure 110, and includes a speaker 170 on exterior side 151 of the enclosure and metal contact spades 172 on an interior side 153 of the enclosure 110. Control panel 120 includes a panel interface defined as a mechanism for receiving the contact spades 174. In one example, the mechanism for receiving the contact spades 174 includes spring loaded terminals or receptacles. In operation, when control board 120 is inserted into enclosure 110, the audible alarm 152 is quick coupled to control board 140 since the contact spades 172 are inserted into the mechanism for receiving the contact spades 174.

In another example, the audible device 152 includes a housing having an opening into the interior 153 of the enclosure 110. A panel interface in the form of an alarm speaker is positioned on the end of a member that extends from the control panel 120 (and control board 140). During assembly, when the control panel 120 is inserted into the enclosure 110 the extension member with the alarm speaker is inserted through the opening into the audible alarm housing. The speaker is now positioned exterior to the enclosure 110 for use.

In another example, the audible alarm may include a panel interface including mechanical diaphragm on the control panel 120 in communication with an audible device positioned on the enclosure 110 exterior 151. In operation, vibration of the diaphragm on the control panel results in activation of the audible device indicating an audible alarm.

Other pilot devices 112 are positioned in a similar manner to quick couple to the control panel 120 when the control panel 120 is inserted into the enclosure 110. In one example, the pilot device 112 is a switch 154. In one example, switch 154 is a push-button switch. The push-button switch 154 is used to clear control panel alarms. Push-button switch 154 is coupled to the enclosure 110, and includes a manually operable push-button 180 on the exterior side 151 of the enclosure 110 that operates to move a switch member 182 on an interior side 153 of the enclosure 110. When the control panel 120 is inserted into the enclosure 110, the switch member 182 is aligned with a panel interface in the form of a switch member 184 on the control panel 120 for operation of the switch.

Figure 5:
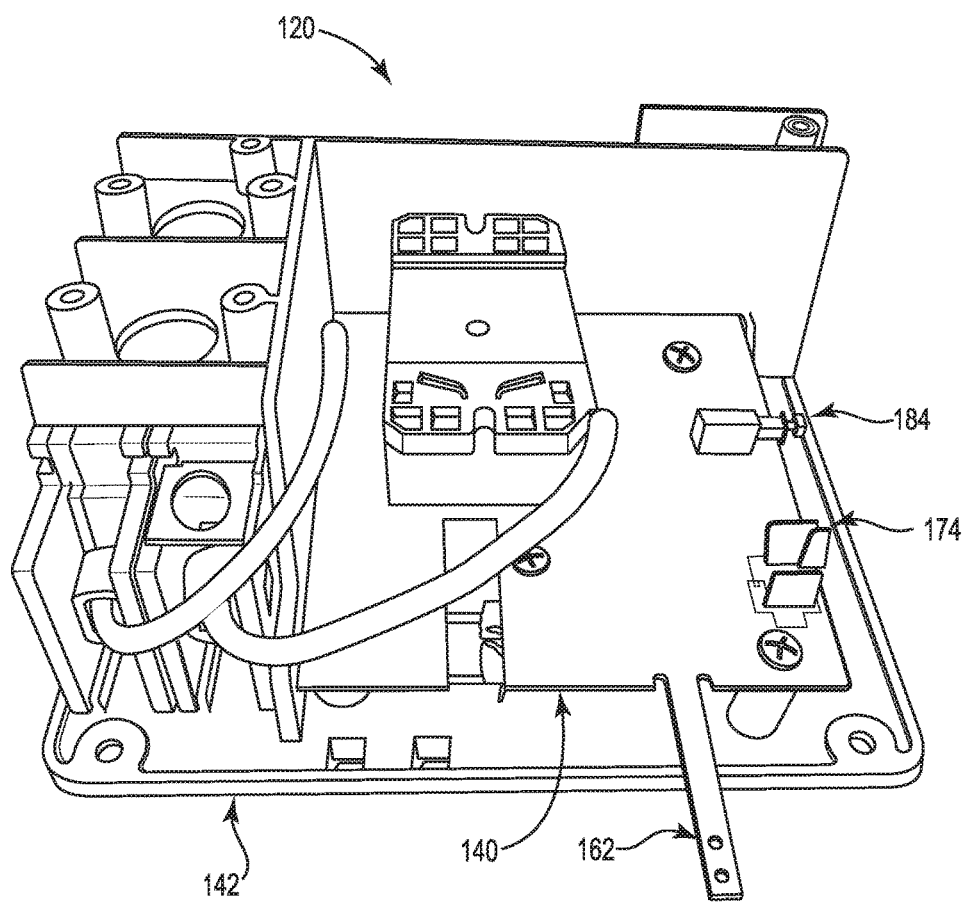
FIG. 5 illustrates one example of a control panel including a control board positioned on a support member.

FIG. 5 illustrates one example of a control panel 120, including the control board 140 positioned on the back side and secured to the support member 142. One example of an extension member extending from control board 140 is illustrated at 162. One example of a mechanism for receiving the contact spades is illustrated at 174. Additionally, one example of a control panel switch member is illustrated at 184.

Figure 6:
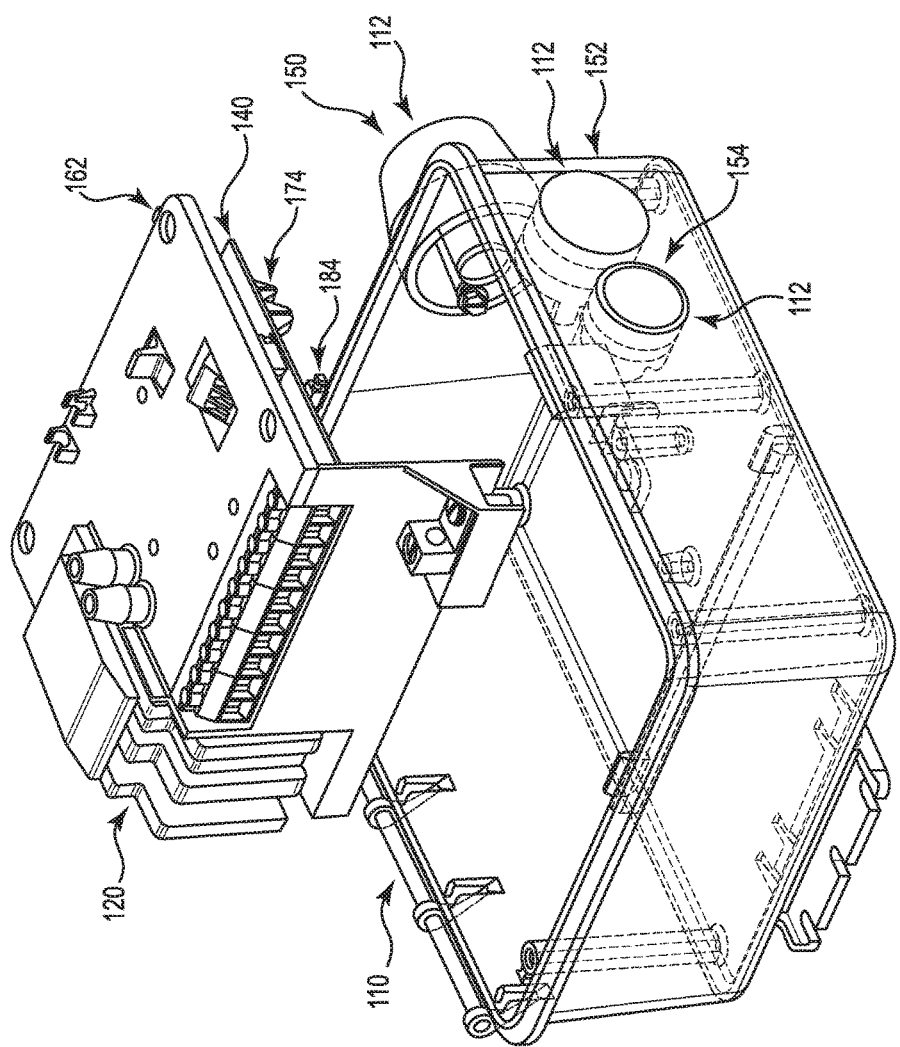
FIG. 6 illustrates one example of a control panel being inserted into an enclosure.
Figure 7:
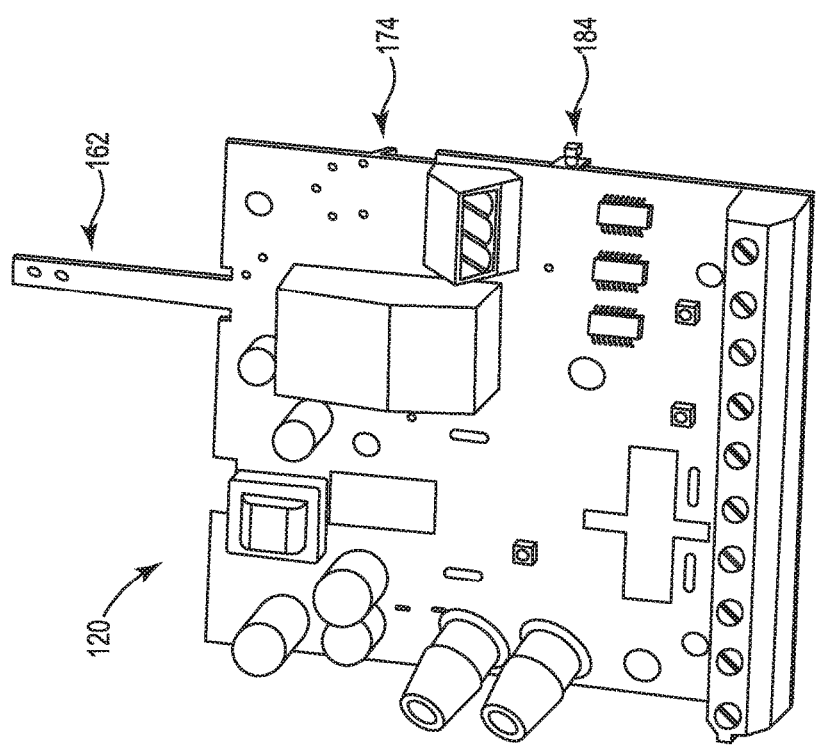
FIG. 7 illustrates one example of a control board.
Figure 8:
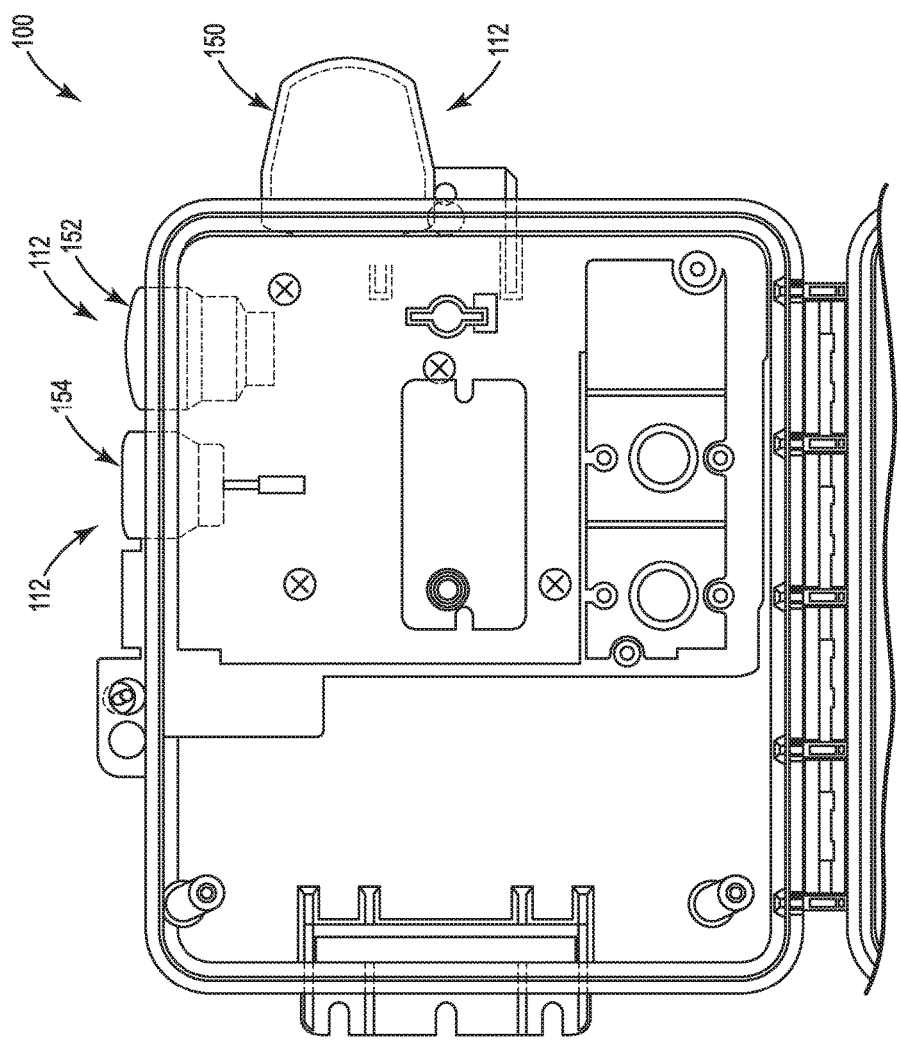
FIG. 8 illustrates another example of a control panel assembly including a control panel inserted into an enclosure.
Figure 9:
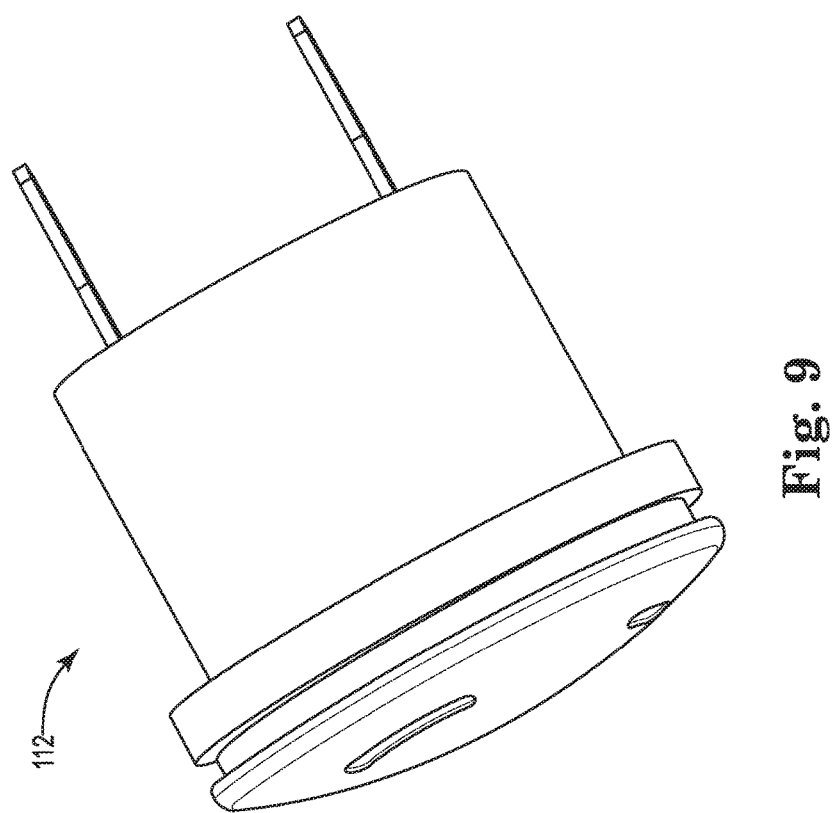
FIG. 9 illustrates one example of a pilot device.
Figure 10:
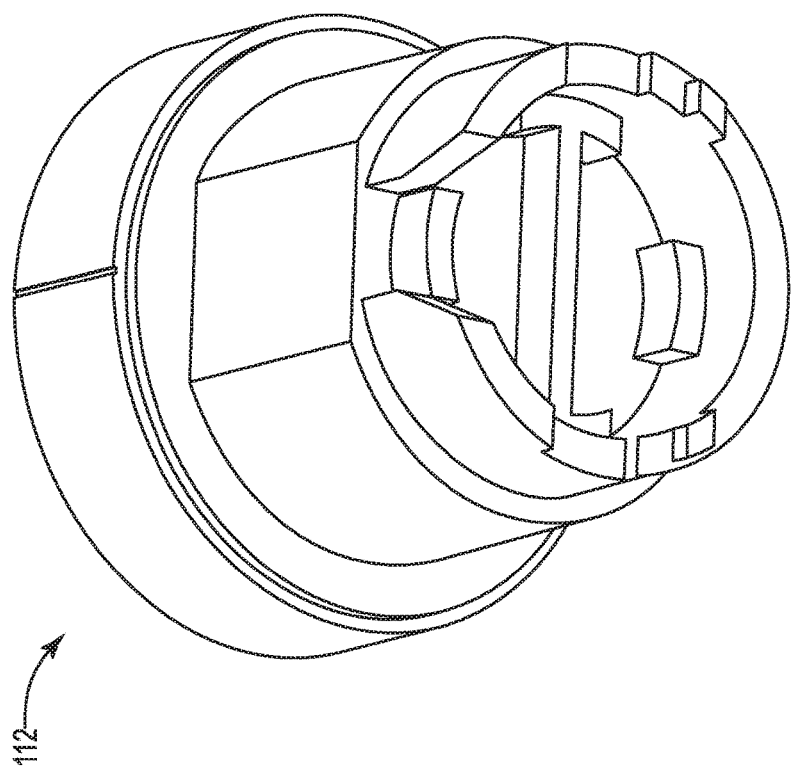
FIG. 10 illustrates another example of a pilot device.

FIG. 6 is an additional diagram illustrating a control panel 120 being inserted into an enclosure 110 similar to that previously described herein. As shown, control panel 120 is a pre-assembled control panel. When the control panel 120 is inserted into enclosure 110, all pilot devices 150 quick connected to the control panel allowing control communication between the pilot devices and the control panel. The control panel 120 itself is secured (e.g., via mechanical screws) to enclosure 110. FIG. 7 illustrates another example of a control board 140, including extension 162, contact spades 174, and control panel switch member 184. Other control panel elements are also shown. FIG. 8 illustrates another example of a control panel assembly 100 after a control panel 120 is inserted an enclosure 110. FIGS. 9 and 10 include examples of pilot devices 112.

Figure 11:
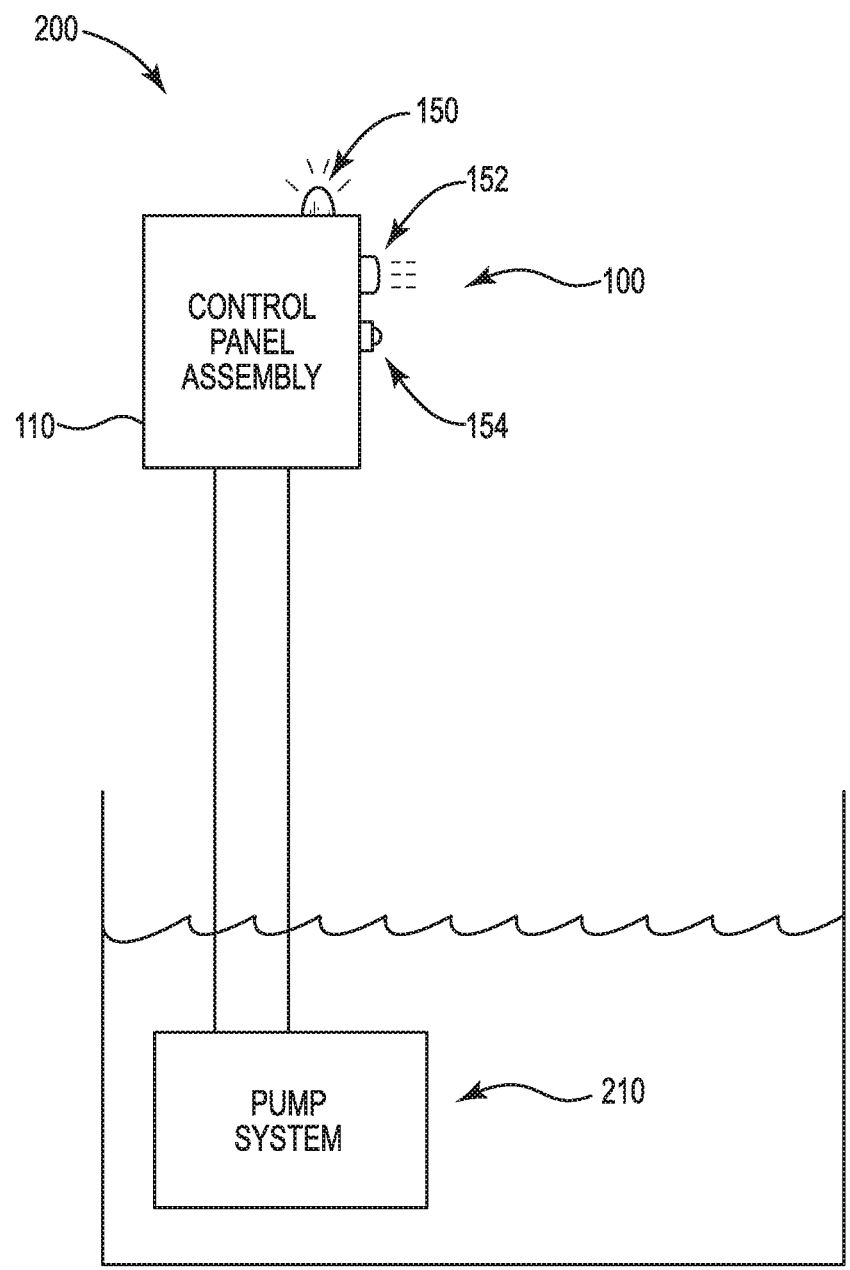
FIG. 11 illustrates one example of a system including a control panel assembly.

FIG. 11 illustrates one example of a system 200 including control panel assembly 100. In one example, the control panel assembly 100 is used in control and operation of a pump system 210, such as a submersible pump system. The control panel assembly 100 includes pilot devices 112. The pilot devices 112 are similar to the pilot devices previously described herein, and are quick connected to the control panel assembly 100.

In one example illustrated, the control panel assembly includes multiple pilot devices for use with a single system. In other embodiments, the control panel assembly is an easy assembly control panel assembly as detailed herein and includes one or more pilot devices for use with multiple systems. For example, a single control panel assembly may be used to control multiple pump systems.

Figure 12:
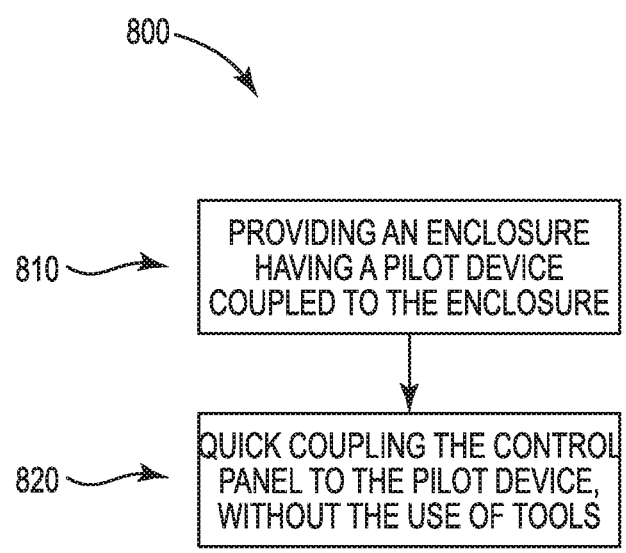
FIG. 12 illustrates one example of a method of assembling a control panel assembly.

FIG. 12 illustrates at 800 one example of a method of assembling a control panel assembly. At 810, an enclosure is provided having a pilot device coupled to the enclosure. At 820, a control panel is quick coupled to the pilot device, without the use of tools. In one aspect, the control panel is a pre-assembled control panel and secured to the enclosure. The control panel assembly is hard-wired to other external devices, such as a submersible pump or other control system.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A control panel assembly comprising:
   an enclosure;
   a pilot device coupled to the enclosure;
   a control panel positioned at the enclosure, including a panel interface quick coupled to the pilot device, thereby allowing control communication between the pilot device and the control panel;
   where the pilot device is a visual notification beacon including a beacon housing secured to an external side of the enclosure; and
   the enclosure including an opening, where the beacon housing is positioned over the opening; and the panel interface includes an extension that extends into the opening and is quick coupled to the visual notification beacon without the use of tools.

2. The assembly of claim 1, where the control panel is a pre-assembled control panel secured to the enclosure.

3. The assembly of claim 1, where the extension includes a light positioned at an extension end, where the extension end extends through the opening into the beacon housing thereby providing a light source to the beacon housing.

4. The assembly of claim 1, where the visual notification beacon includes a beacon electrode electrically coupled to a light positioned within the beacon housing, and the extension member includes an electrode contact that mechanically mates with the beacon electrode.

5. The assembly of claim 4, where the beacon electrode is positioned inside the beacon housing.

6. The assembly of claim 1, further comprising a second pilot device where the second pilot device is an audible device coupled to an external side of the enclosure.

7. The assembly of claim 6, the enclosure including an opening, where the audible device is positioned over the opening; and the panel interface includes an extension that extends to the opening and is quick coupled to the audible device without the use of tools.

8. The assembly of claim 7, where the audible device includes a speaker on the external side of the enclosure, and contact spades on the internal side of the enclosure, and where the extension comprises a mechanism for receiving the contact spades for quick coupling the audible device to the control panel.

9. The assembly of claim 8, where the mechanism for receiving the contact spades includes spring loaded terminals.

10. The assembly of claim 1, further comprising a second pilot device, where the second pilot device is a switch.

11. The assembly of claim 10, the enclosure including an opening, where the switch is positioned over the opening; and the panel interface includes a switch member on an interior side of the panel.

12. The assembly of claim 11, where the switch includes a push-button switch coupled to an exterior side of the enclosure, that cooperates to move the switch member on the interior side of the enclosure.

13. A method of assembling the control panel assembly of claim 1 comprising:
   providing the enclosure having the pilot device coupled to an external side of the enclosure; and
   positioning the control panel in the enclosure, thereby quick coupling the control panel to the pilot device without the use of tools.

14. The method of claim 13, comprising securing the control panel to an interior side of the enclosure.

15. The method of claim 14, where the control panel is a pre-assembled control panel.

16. A control panel assembly comprising:
   an enclosure;
   a first pilot device and a second pilot device coupled to the enclosure;
   a control panel positioned at the enclosure, including a first panel interface quick coupled to the first pilot device and a second panel interface quick coupled to the second pilot device, thereby allowing control communication between the first pilot device and the control panel, and the second pilot device and the control panel; and
   where the first pilot device is a visual notification beacon including a beacon housing secured to an external side of the enclosure, and the second pilot device is a switch.

17. The assembly of claim 16, further comprising a third pilot device coupled to the enclosure.

* * * * *